(12) United States Patent
Habib et al.

(10) Patent No.: US 12,388,293 B2
(45) Date of Patent: Aug. 12, 2025

(54) HYBRID BRIDGE TRANSFER SWITCH SYSTEM AND METHODS

(71) Applicant: ABB Schweiz AG, Baden (CH)

(72) Inventors: Hany Habib, Richmond, VA (US); Christopher Alan Belcastro, Mechanicsville, VA (US); Veerakumar Bose, Richmond, VA (US); Thomas Anthony Kendzia, III, Henrico, VA (US)

(73) Assignee: ABB SCHWEIZ AG, Baden (CH)

( * ) Notice: Subject to any disclaimer, the term of this patent is extended or adjusted under 35 U.S.C. 154(b) by 0 days.

(21) Appl. No.: 18/470,274

(22) Filed: Sep. 19, 2023

(65) Prior Publication Data

US 2025/0096597 A1 Mar. 20, 2025

(51) Int. Cl.
*H02J 9/06* (2006.01)
*H03K 17/56* (2006.01)

(52) U.S. Cl.
CPC .............. *H02J 9/068* (2020.01); *H03K 17/56* (2013.01)

(58) Field of Classification Search
CPC .................................. H02J 9/068; H03K 17/56
See application file for complete search history.

(56) References Cited

U.S. PATENT DOCUMENTS

| | | | |
|---|---|---|---|
| 2009/0072623 A1* | 3/2009 | Liao | H02J 9/061 307/65 |
| 2014/0039711 A1* | 2/2014 | Divan | G06Q 30/0279 700/291 |
| 2021/0273440 A1* | 9/2021 | Kang | H01L 21/67 |
| 2022/0247167 A1* | 8/2022 | Song | H02H 1/0007 |

FOREIGN PATENT DOCUMENTS

WO   2023114669 A1   6/2023

* cited by examiner

*Primary Examiner* — Carlos Amaya
(74) *Attorney, Agent, or Firm* — Greenberg Traurig, LLP

(57) ABSTRACT

A transfer switch for hybrid switching between a first power source and a second power source, the transfer switch includes a first switch and a second switch, the first and second switch connecting a load to a first power source and a second power source, respectively. The first switch includes at least one first solid state switching device (SSSD) pair. The second switch includes at least one second SSSD pair. The at least one first SSSD pair includes a different type of switching devices relative to the type of switching devices of the at least one second SSSD pair. Moreover, a controller may be configured to selectively cycle the at least one first SSSD pair and the at least one second SSSD pair on and off to electrically couple one of the first power source and the second power source to the load.

20 Claims, 6 Drawing Sheets

HYBRID BRIDGE TRANSFER SWITCH SYSTEM AND METHODS

FIELD

The present disclosure relates to the field of transfer switches. And, more particularly, to improving reliability against electrical current instability in transfer switches.

BACKGROUND

Transfer switches are typically used to control the electrical power supply to critical electrical components such as, for example, data centers where a constant, high-quality electrical supply is required. Transfer switches couple electrical load(s) to two electrical power sources. Typically, the electrical power sources may be a primary grid-tied power source and an alternate source such as, for example, electrical generators or a renewable power source. When the electrical power supplied from the primary electrical power source is interrupted, or when fluctuations are detected at the primary electrical power source, the transfer switch performs a switching operation and transfers connection of the electrical load(s) to the secondary electrical power source, where the electrical loads(s) may remain connected until such time as the primary power source stabilizes and the electrical load(s) may be reconnected to the primary electrical power source.

SUMMARY

An objective for ensuring the health of transformers is to maintain a continuous power supply to downstream electrical loads such as, for example, data center applications. When a transformer is initially energized or reenergized using a transfer switch after a brief interruption, it can draw a high inrush current from the system due to residual flux in the core. In certain applications such as in data centers, the inrush current during transformer energization can be significantly higher than the system's rated current, potentially reaching levels that trigger the protection circuit breakers to trip open to isolate the electrical load from the connected power source. Such high inrush currents also put significant stress on the upstream uninterruptible power supply (UPS) and may lead to malfunctions.

In some embodiments, a transfer switch includes a first switch including at least one first solid state switching device (SSSD) pair, the first switch electrically connecting a first power source to a load, a second switch including at least one second SSSD pair, the second switch electrically connecting a second power source to the load, the at least one first SSSD pair including a different type of switching device relative to the at least one second SSSD pair, and a controller is configured to selectively cycle the at least one first SSSD pair and the at least one second SSSD pair on and off to electrically couple one of the first power source and the second power source to the load.

In some embodiments, the first switch includes a plurality of first SSSD pairs, and each of the first SSSD pairs are connected in anti-series.

In some embodiments, each switching device of the at least one first SSSD pair is selected from a group including SiC metal-oxide-semiconductor field-effect transistors (MOSFETs), insulated gate bipolar transistors (IGBTs), bipolar junction transistors (BJTs), junction-gate field effect transistors (JFETs), or any combinations thereof.

In some embodiments, each switching device of the at least one first SSSD pair includes SiC MOSFETS.

In some embodiments, each switching device of the at least one first SSSD pair is selected from a group consisting of SiC MOSFETs, IGBTs, BJTs, JFETs, or any combinations thereof.

In some embodiments, the second switch includes a plurality of second SSSD pairs, the plurality of second SSSD pairs are connected in anti-parallel.

In some embodiments, each switching device of the at least one second SSSD pair is selected from a group including SiC MOSFETs, IGBTs, BJTs, JFETs, silicon controlled rectifiers (SCRs), SCRs with paralleled resistive turn-off (RTO) circuits, or any combinations thereof.

In some embodiments, each switching device of the at least one second SSSD pair includes SCRs with paralleled RTO circuits.

In some embodiments, each switching device of the at least one second SSSD pair is selected from a group consisting of SCRs, SCRs with paralleled RTO circuits, or any combinations thereof.

In some embodiments, the transfer switch further includes the controller, the controller including a processor and a non-transitory computer readable medium having stored thereon instructions executable by the processor to enable the controller to perform operations including send a first set of gate signals to the at least one first SSSD pair to open the first switch in response to detecting an abnormal condition at the first power source, and after a time delay, sending a second set of gate signals to the at least one second SSSD pair to close the second switch and to connect the load to the second power source.

In some embodiments, the time delay for transferring the load between the first power source and the second power source is less than 10 msec.

In some embodiments, the controller transfers the load from the first power source to the second power source when the first power source and the second power source are out of phase by more than 30°.

In some embodiments, a computer-implemented method for operating a transfer switch including a first switch and a second switch, the method including determining, by a controller, an abnormal condition at a first power source in electrical connection with the transfer switch, sending, by the controller and based on a first logic, a first set of gate signals to the first switch to open at least one first SSSD pair in response to detecting the abnormal condition at the first power source, and following a time delay, sending, by the controller and based on a second logic, a second set of gate signals to the second switch to close at least one second SSSD pair and to connect a load to a second power source, the at least one first SSSD pair includes a different type of switching devices relative to the at least one second SSSD pair.

In some embodiments, the delay time for transferring the load between the first power source and the second power source is less than 10 msec.

In some embodiments, the delay time for transferring the load is further configured to include when the first power source and the second power source are out of phase by more than 30°.

In some embodiments, the first logic is configured to operate switching devices of the at least one first SSSD pair, and the second logic is configured to operate switching devices of the at least one second SSSD pair.

In some embodiments, the first switch includes a plurality of first SSSD pairs, and the second switch includes a plurality of second SSSD pairs, each switching device in the plurality of first SSSD pairs are connected in anti-series and each switching device in the plurality of second SSSD pairs are connected in anti-parallel.

In some embodiments, a system including a first power source, a second power source, an electrical load, a transfer switch including a first switch including a plurality of first SSSD pairs connected in parallel between the first power source and the electrical load, and a second switch including a plurality of second SSSD pairs connected in parallel between the second power source and the electrical load, the plurality of first SSSD pairs includes different type of switching devices relative to the plurality of second SSSD pairs, and a controller including a processor, and a non-transitory computer readable medium having stored thereon instructions executable by the processor to enable the controller to perform operations including determine an abnormal condition at the first power source in electrical connection with the transfer switch, send a first set of gate signals to the plurality of first SSSD pairs to open the first switch in response to detecting an abnormal condition at the first power source, and after a time delay, sending a second set of gate signals to the plurality of second SSSD pairs to close the second switch and to connect the electrical load to the second power source.

In some embodiments, each switching device of the plurality of first SSSD pairs includes SiC MOSFETs connected in anti-series, each switching device of the plurality of second SSSD pairs includes SCRs with paralleled RTO circuits connected in anti-parallel.

In some embodiments, the time delay for transferring the electrical load between the first power source and the second power source is less than 10 msec, the controller transfers the electrical load from the first power source to the second power source when the first power source and the second power source are out of phase by more than 30°.

BRIEF DESCRIPTION OF THE DRAWINGS

Some embodiments of the disclosure are herein described, by way of example only, with reference to the accompanying drawings. With specific reference now to the drawings in detail, it is stressed that the embodiments shown are by way of example and for purposes of illustrative discussion of embodiments of the disclosure. In this regard, the description taken with the drawings makes apparent to those skilled in the art how embodiments of the disclosure may be practiced.

DETAILED DESCRIPTION

Figure 1:
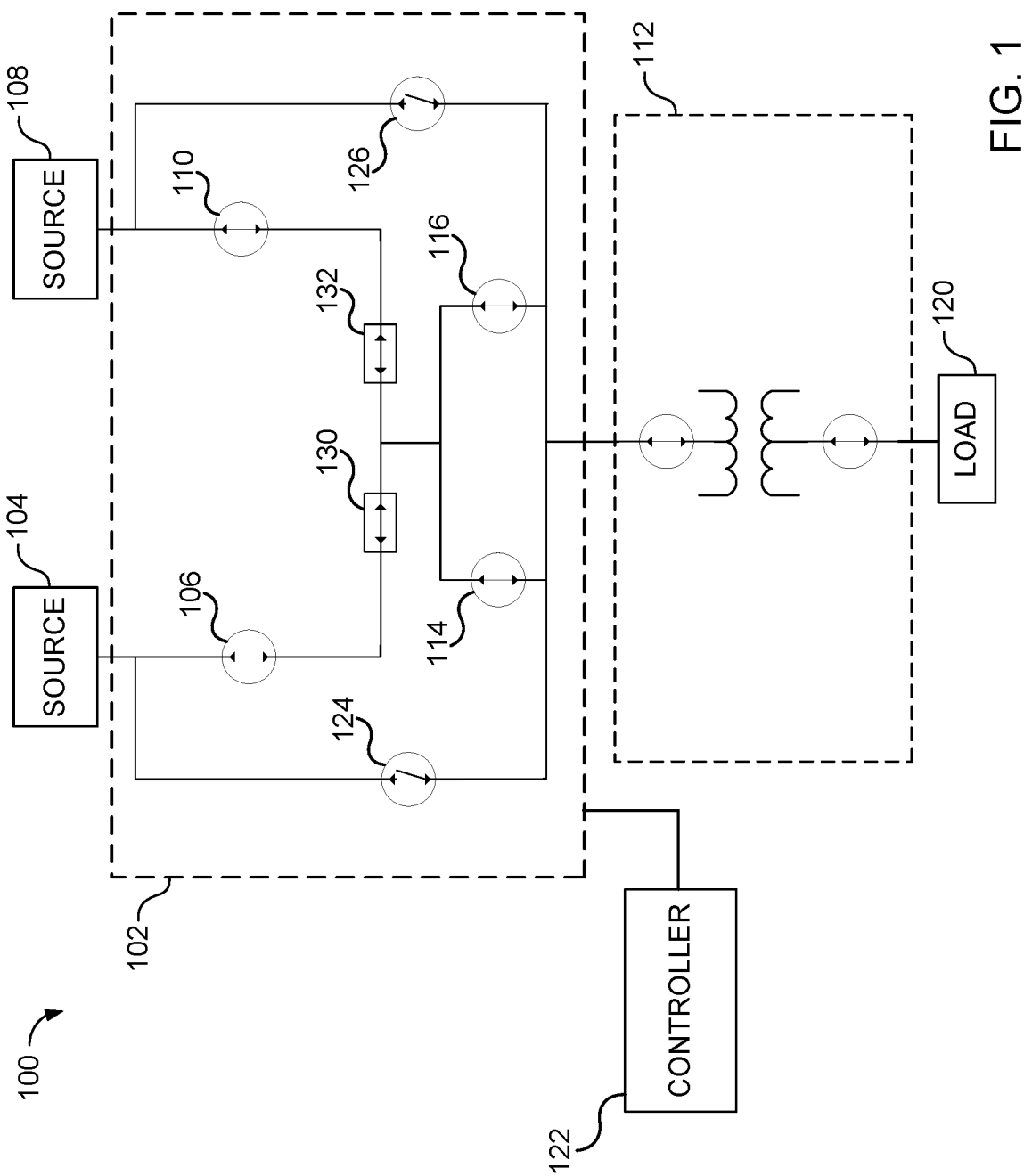
FIG. 1 illustrates a schematic diagram of a system, according to some embodiments.

Conventional approaches to reducing inrush current include utilizing a high-grade steel core with a higher saturation flux density. Another approach enhances transformer core construction. Furthermore, a different approach incorporates additional impedance to the transformer windings. However, these conventional approaches to reduce inrush current come at the expense of increased costs to build the transformer core, which can result in requiring more complex transformer designs, and in the case of increasing the impedance in the windings, can lead to higher transformer losses.

In addition, conventional transfer switches can be constructed to mitigate inrush current. Conventional transfer switches typically include a first switch connecting a primary power source to the electrical load and a second switch connecting a secondary power source to the electrical load. When fluctuations or instability are detected at the primary power source, the transfer switch is triggered to switch from the first switch to the second switch. In conventional transfer switch topologies, the first switch and the second switch use the same type of semiconductor switching device, which may be a resonant turn off (RTO) thyristor based switch or a fully controlled power semiconductor switching device. Typically, the same type of switching device is used on both legs as different types of switching devices operate based on a different logics and typically requires a separate controller to operate each type of switching device. However, transfer switching including fully controlled power semiconductor devices may be more costly to manufacture and implement than using RTO thyristor based switching devices, whereas RTO thyristor based switching devices may be incapable of meeting the high switching frequencies demanded by certain applications.

Various embodiments of the present disclosure relate to systems, apparatus, and methods including a hybrid transfer switch that includes a first switch at one side or leg (e.g., connected to the primary power source) and a second switch at the other side or leg (e.g., connected to the secondary power source), the first switch and the second switch including different types of solid-state switching devices (SSSDs) therein relative to the other of the first switch and the second switch. The first switch may include one or more first SSSDs and the second switch may include one or more second SSSDs. In some embodiments, the first SSSDs may be fully controlled power semiconductor devices, and the second SSSDs may be RTO thyristor based switching devices. Moreover, in one or more embodiments, a controller may control the switching operations of the first switch and second switch and may include one or more logics configured to apply one or more algorithms to operate the different types of SSSDs in the first switch and the second switch, respectively, using a single controller. This increases the overall reliability of the system during an overload condition, thereby preventing interruptions in the power supply to the electrical load (e.g., data centers).

The controller may include therein a single logic circuit configured to operate switching devices of different types, thereby removing the need to include individual controllers to control different switching device types. In some embodiments, the single controller may operate the first switch including therein one or more first switching devices arranged in one or more switching pairs and may simultaneously operate the second switch including therein one or more second switching devices arranged in one or more switching pairs.

Various embodiments of the present disclosure may relate to a system including a transfer switch and a controller that controls an operation of the transfer switch including different types of SSSD in connection with the primary power source and the secondary power source, respectively. The controller includes a logic that is capable of controlling the switching operations of the two different types of SSSD to reduce inrush current and can prevent transformer failure due to excessive inrush current to upstream devices. Additionally, the various embodiments described herein can prevent the upstream breakers from tripping, thereby preventing a load drop for the electrical load. Accordingly, the various embodiments increase the life expectancy for upstream data center devices and enables the system to utilize transfer switches having a hybrid bridge topology, which reduces the cost of the system.

Among those benefits and improvements that have been disclosed, other objects and advantages of this disclosure will become apparent from the following description taken in conjunction with the accompanying figures. Detailed embodiments of the present disclosure are disclosed herein; however, it is to be understood that the disclosed embodiments are merely illustrative of the disclosure that may be embodied in various forms. In addition, each of the examples given regarding the various embodiments of the disclosure which are intended to be illustrative, and not restrictive.

FIG. 1 illustrates a schematic diagram of a system 100, according to some embodiments.

The system 100 includes a transfer switch 102 which is conductively coupled to a first electrical power source 104, hereinafter referred to as first source 104, via a first mechanical circuit breaker (MCB) 106, and a second electrical power source 108, hereinafter referred to as second source 108, which is conductively coupled with the transfer switch 102 via a second MCB 110. In some embodiments, the system 100 may be electrically connected to a transformer 112 at a primary side which is conductively coupled with the transfer switch 102 via a third MCB 114 and a fourth MCB 116, and a secondary side which is conductively coupled with a load 120.

The first source 104 and the second source 108 may be a number of forms and types of electrical power sources, for example, a utility grid, a microgrid, a nanogrid, a backup generator, an uninterruptable power supply (UPS) or backup battery, a flywheel operatively coupled with a motor/generator, a PV array, a wind farm, a fuel cell installation, or any of a number of other sources of electrical power as will occur to one of skill in the art with the benefit of the present disclosure. One of the first source 104 and the second source 108 may be a primary or preferred power source for the system 100 and the other of the first source 104 and the second source 108 may be a secondary or backup power source for the system 100. In some embodiments, the first source 104 may be a utility grid serving as a primary power source and the second source 108 may be one or more UPS serving as a backup power source. In some embodiments, the transfer switch 102 may also be considered and referred to as a bypass switch or a UPS bypass switch. The load 120 may be any of a variety of types of load systems, for example, a datacenter, educational facility, governmental facility, hospital or other healthcare facility, manufacturing, chemical or other industrial plant, water treatment plant, or other types of loads or load systems as will occur to one of skill in the art with the benefit of the present disclosure.

The MCB 106, 110, 114, 116 are configured and operable to provide fault protection by transitioning from a closed-circuit state to an open-circuit state in response to a fault condition, such as an over-current condition, an over-voltage condition, and/or another fault condition. Furthermore, the MCB 106, 110, 114, 116 may be configured and operable to provide passive fault protection or other active opening or closing operation (e.g., in response to control signals received from the electronic control system (ECS) 122), or both. It shall be appreciated that certain embodiments may omit one or more of the MCB 106, 110, 114, 116. Furthermore, certain embodiments may comprise additional or alternate fault protection devices as will occur to one of skill in the art with the benefit of the present disclosure.

The system 100 may also include a fifth MCB 124, which may be conductively coupled between the first source 104 and the transformer 112, and a sixth MCB 126, which may be conductively coupled between the second source 108 and the transformer 112, according to some embodiments. The MCB 124, 126 are configured to selectably provide a closed circuit connection between the first source 104 and the second source 108, respectively, bypassing the transfer switch 102 and may be actively controlled by the ECS 122, hereinafter referred to as controller 122. It shall be appreciated that certain embodiments may omit one or both of the MCB 124, 126. Furthermore, certain embodiments may include additional or alternate bypass devices as will occur to one of skill in the art with the benefit of the present disclosure.

The transfer switch 102 includes switch 130 and switch 132. Switch 130 and switch 132 can be controlled by controller 122 to energize (or deenergize) the transformer 112 by conductively coupling (or decoupling) the transformer 112 with the first source 104 or the second source 108, respectively. Switch 130 includes one or more SSSDs 134 arranged in switching pairs to enable a bi-directional flow of current at switch 130. Switch 132 includes one or more SSSDs 136 arranged in switching pairs to enable a bi-directional flow of current at switch 132. The SSSDs 134, 136 arranged in switch 130 and switch 132 may include, but are not limited to, SiC metal-oxide-semiconductor field-effect transistors (MOSFETs), insulated gate bipolar transistors (IGBTs), bipolar junction transistors (BJTs), junction-gate field effect transistors (JFETs), silicon controlled rectifiers (SCRs), SCRs with paralleled resistive turn-off (RTO) circuits, or any combinations thereof, according to some embodiments.

In addition, the SSSDs 134 in switch 130 may be one type of switching device and the SSSDs 136 in switch 132 may be a different type of switching device distinct from the SSSDs 134 in switch 130. For example, the SSSDs 134 in switch 130 may be SiC MOSFETs, and the SSSDs 136 in switch 132 may be SCRs. In some embodiments, the SSSDs 134 in switch 130 may be fully controlled power semiconductor switching devices including the group of SiC MOSFETS, IGBTs, BJTs, JFETs, other fully controlled power semiconductor switching devices, or any combinations thereof. In other embodiments, the SSSDs 134 in switch 130 may be fully controlled power semiconductor switching devices consisting of the group of SiC MOSFETS, IGBTs, BJTs, JFETs, or any combinations thereof. Moreover, in some embodiments, the SSSDs 136 in switch 132 may be thyristor based switching devices including silicon controlled rectifiers (SCRs), SCRs with paralleled resistive turn-off (RTO) circuits, or any combinations thereof. In other embodiments, the SSSDs 136 in switch 132 may be thyristor based switching devices consisting of the group of silicon controlled rectifiers (SCRs), SCRs with paralleled resistive turn-off (RTO) circuits, or any combinations thereof.

Controller 122 may selectively send gate control signals to switch 130 and switch 132 to control the cycling of the respective switch, and the respective SSSDs therein, on and off and to connect/disconnect the load 120 from the first source 104 and/or the second source 108, respectively. Controller 122 may control the operation of switch 130 to cycle to an on or closed state to conductively couple the first source 104 with the transformer 112 and load 120 (provided that the MCB 106, 114 are in a closed state) and to an off or open state which conductively decouples the first source 104 with the transformer 112. Switch 132 may be controlled by controller 122 to an on or closed state which conductively couples the second source 108 with the transformer 112 (provided that the MCB 110, 116 are in a closed state) and to an off or open state which conductively decouples the second source 108 with the transformer 112. The switches 130 may be provided in a number of configurations and forms including, for example, the forms illustrated and described below in connection with FIGS. 2 and 3.

The controller 122 may include a processor and a memory. The memory may be a computer readable medium having stored thereon instructions executable by the processor to perform operations in accordance with the present disclosure. The controller 122 includes a logic capable of controlling an operation of the transfer switch 102 including sending one or more gating signals to control an operation of switches 130. The controller 122 may include one or more other components, including components capable of placing the controller 122 in electrically communicable connection with the transfer switch 102 and to monitor and control the operation of the transfer switch 102 based on one or more parameters measured at the transfer switch 102 such as, for example, by one or more sensors (not shown). In some embodiments, the controller 122 may be operatively coupled with the transfer switch 102.

Additionally, in some embodiments, the controller 122 may in some forms also be operatively coupled with one or more of the MCB 106, 110, 114, 116, 124, 126 and may monitor and/or actively control one or more of the MCB 106, 110, 114, 116, 124, 126. The controller 122 may be provided as a portion or component of the transfer switch 102 (e.g., provided in a common housing or as a common unit), as one or more separate components, or distributed among one or more components forming a portion of the transfer switch 102 and one or more separate components. The controller 122 may include one or more integrated circuit-based (e.g., microprocessor-based, microcontroller-based, ASIC-based, FPGA-based, and/or DSP-based) control units as well as related driver, input/output, signal conditioning, signal conversion, non-transitory machine-readable memory devices storing executable instructions, and other circuitry.

It shall be appreciated that system 100 may be provided in a single-phase form, a three-phase form, or other multi-phase forms. Such multi-phase forms, the first source 104 and the second source 108 may be multi-phase power sources (e.g., three-phase power sources). In such forms, the MCB 106, 110, 114, 116, 124, 126, the transfer switch 102 and its constituent switches including switch 130 and switch 132, and the transformer 112, may be provided in corresponding multi-phase forms and arrangements (e.g., three-phase forms and arrangements) wherein an additional instance of these components may be provided to service each additional phase. Furthermore, while system 100 is illustrated as comprising a first source 104 and a second source 108, it shall be appreciated that additional sources may also be present in certain embodiments and that such additional sources may include additional respective MCB components for fault protection and bypass operation and additional respective constituent switch 130 and/or switch 132 of the transfer switch 102.

In some embodiments, the switch 130 may include at least one switching pair of SSSDs 134 consisting of SiC MOSFETs, and switch 132 may include at least one switching pair of SSSDs 136 consisting of SCRs. The switch 130 including the SiC MOSFETs may be connected to the first source 104 due to the SSSDs 134 fast switching capability in case of an abnormal condition at the first source 104, which reduces the transfer time for transferring power from the first source 104 to the second source 108 in case of an abnormal condition. For example, the SiC MOSFET may have a transfer time of 10 msec, whereas the SCR may have a transfer time of more than 16 msec. However, as SiC MOSFET's have low surge current capability, transferring to the switch 132 side with the SCRs is essential during overload conditions.

Conventional transfer switch topologies typically utilize the same type of switching device at each leg of the transfer switch. As such, both the first switch and second switch that connects the load to the first power source and the second power source, respectively, include the same type of switching device. Conventional transfer switch topologies typically do not utilize hybrid topologies as different types of switching devices operate based on different logics. Accordingly, conventional systems of the prior art do not utilize such hybrid transfer switch topologies as doing so requires a controller for each switch to operate the different types of respective switching devices therein based on the different logics. Furthermore, conventional transfer switches of the prior art typically utilize switches including fully controlled power semiconductor devices (e.g., SiC MOSFETs) therein over SCR based thyristors arranged in a parallel configuration between the load and the power source as such switches connected to the primary power source can be difficult to operate and such SCR based switches have certain requirements for transferring power that can cause delays in switching, thereby leading to an increased likelihood of causing damage to downstream components and loads.

Figure 2:
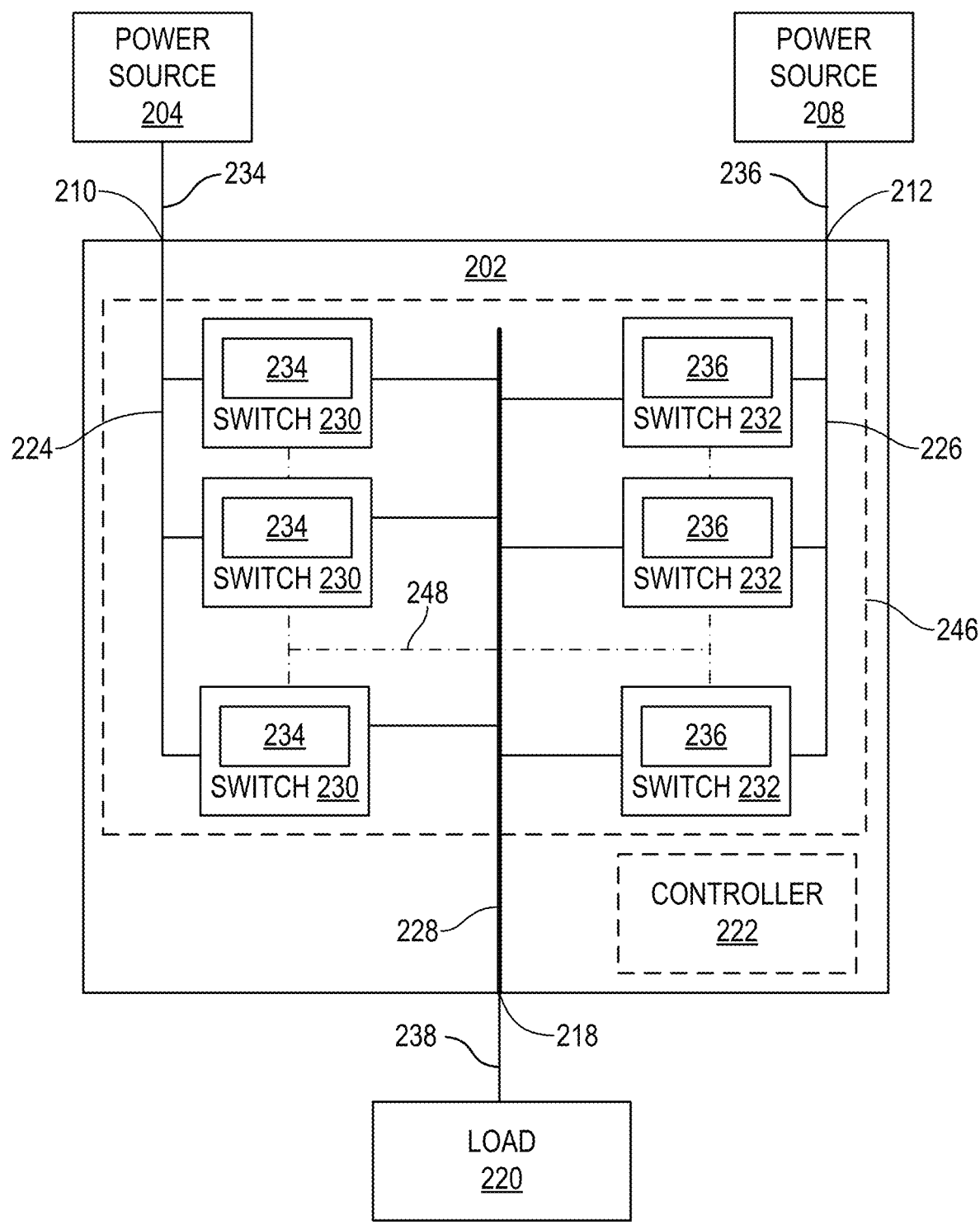
FIG. 2 illustrates a schematic view of a portion of the system in FIG. 1, according to some embodiments.

FIG. 2 illustrates a schematic view of a portion of the system 100 in FIG. 1, according to some embodiments.

The system 200 includes a modular static transfer switch (MSTS) 202 that selectively supplies a load 220 with electrical power from either a first power source 204 or a second power source 208 depending on various criteria. For example, MSTS 202 may supply electrical power to load 220 primarily from first power source 204 unless the electrical power delivered by first power source 204 falls outside of a desired range of values (e.g., first power source 204 has a voltage and/or a harmonic distortion that varies from target values by a threshold amount). If, for example, first power source 204 is either incapable of supplying electrical power to load 220 (e.g., first power source 204 fails or is incapable of supplying electrical power to load 220 at a desired power quality), then MSTS 202 switches load 220 from first power source 204 to second power source 208. In this regard, first power source 204 may operate as a preferred power source for load 220, with second power source 208 operating as a backup or alternate power source for load 220. Although only two power sources are depicted in FIG. 2, MSTS 202 selectively couples load 220 to any number of power sources in other embodiments. Further, although MSTS 202 is depicted as switching single phase power in FIG. 2, MSTS 202 switches 3-phase Alternating Current (AC) power in other embodiments. In 3-phase embodiments, first power source 204, second power source 208 are 3-phase sources, and load 220 is a 3-phase load. In other embodiments, first power source 204 and second power source 208 are Direct Current (DC) sources, and load 220 is a DC load. In other embodiments, first power source 204 and second power source 208 are 3-phase sources, and MSTS provides a plurality of sign-phase loads (e.g., load 220 is a plurality of single-phase loads).

The first power source 204 is electrically coupled to MSTS 202 at a first input 210 and second power source 208 is electrically coupled to MSTS 202 at a second input 212. Load 220 is electrically coupled to an output 218 of MSTS 202. First input 210 is electrically coupled to a first input bus 224 of MSTS 202 and second input 212 is electrically coupled to a second input bus 226 of MSTS 202. Output 218 of MSTS 202 is electrically coupled to an output bus 228 of MSTS 202.

MSTS 202 includes a plurality of solid-state switch modules 230 and a plurality of solid-state switch modules 232. Switch modules 230 may correspond to the switch 130 and switch modules 232 may correspond to the switch 132, as shown in FIG. 1, according to some embodiments. The switch modules 230 operate to selectively couple first power source 204 to load 220 and the switch modules 232 operate to selectively couple the second power source 206 to load 220. It is to be appreciated by those having ordinary skill in the art that modules 230 and modules 232 may further include any components, systems, or devices which enables the modules 230 and modules 232 to selectively couple load 220 to the first power source 204 or second power source 208, respectively. In some embodiments, modules 230 includes one or more SSSDs 234, which provide a selective bi-directional electrical path between first power source 204 and load 220, and modules 232 includes one or more SSSDs 236, which provide a selective bi-directional electrical path between second power source 208 and load 220. In some embodiments, the SSSDs 234 may correspond to the SSSDs 134 and the SSSDs 236 may correspond to the SSSDs 136 as shown in FIG. 1. The one or more SSSDs 234 and the one or more SSSDs 236 may include any number of combinations of power electronic devices connected in series in order to implement the functionality described herein for switch modules 230 and switch modules 232, respectively. For example, the one or more SSSDs 234 may be connected in anti-series.

Modules 230 are electrically coupled in parallel between first input bus 224 and output bus 228. Modules 232 are electrically coupled in parallel between second input bus 226 and output bus 228. Although only three modules 230 and only three modules 232 are depicted, the MSTS 202 may include any number of modules 230 and modules 232 electrically coupled in parallel in other embodiments. Further, modules 230 and modules 232 include 3-phase inputs and 3-phase outputs in other embodiments, depending on whether first power source 204, second power source 208, and load 220 are 3-phase sources/loads.

MSTS 202 further includes a back panel 246, and modules 230 and modules 232 are removably mounted to back panel 246. When removably mounted, modules 230 and modules 232 may be easily replaced during maintenance, even if MSTS 202 remains energized by first power source 204 or second power source 208 and is supplying electrical power to load 220. Back panel 246 includes, in some embodiments, a communication bus 248, which enables modules 230 to communicate with each other and enables modules 232 to communicate with each other. Communication bus 248 includes any component, system, or device that provides wired or wireless communication capability to a user, modules 230, modules 232, and MSTS 202. During operation, modules 230 and modules 232 may utilize communication bus 248 to coordinate their activities during transfer events. For instance, modules 230 and modules 232 may communicate with each other utilizing communication bus 248 to collaboratively transfer load 220 between first power source 204 and second power source 208.

MSTS 202 includes, in some embodiments, a management controller 222. Management controller 222 includes any component, system, or device that provides management functions for MSTS 202. According to some embodiments, the controller 222 may correspond to the controller 122 as shown in FIG. 1. In some embodiments, management controller 222 communicates with modules 230 and modules 232 via communication bus 248 to manage transfers of load 220 between first power source 204 and second power source 208. Management controller 222 therefore may perform any functionality described herein for MSTS 202 either alone or in combination with one or more of modules 230 and modules 232 in order to perform the functionality described herein for MSTS 202.

Figure 3:
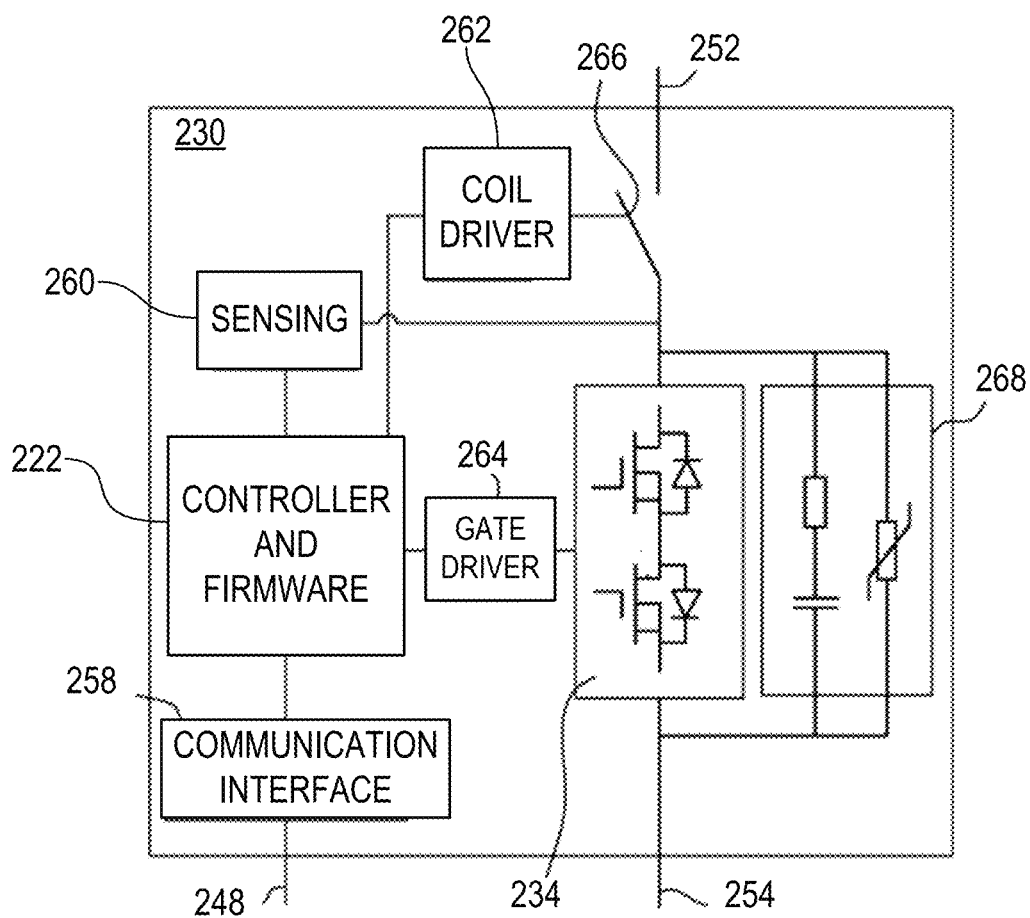
FIG. 3 illustrates a schematic view of a portion of the system in FIG. 1, according to some embodiments.

FIG. 3 illustrates a schematic view of a portion of the system 100 in FIG. 1, according to some embodiments.

MSTS 202 includes a non-limiting example of module 230, according to some embodiments. Module 230 includes electrical terminals 252, 254, which are electrically couplable between output bus 228 in MSTS 202 and first input bus 224. Module 230 in this embodiment further includes a controller 222, a communication interface 258, a sensing circuit 260, a coil driver circuit 262, a gate driver circuit 264, a mechanical disconnect 266, and a snubber circuit 268. Controller 222, communication interface 258, sensing circuit 260, coil driver circuit 262, gate driver circuit 264, mechanical disconnect 266, and snubber circuit 268 include any component, system, or device which implements their respective functionality as described herein.

Controller 222 controls the operation of module 230 and the SSSDs 234 therein and interacts with communication interface 258 to send and/or receive information over communication bus 248. Controller 222 utilizes gate driver circuit 264 to control whether SSSDs 234 are open or closed. Controller 222 also utilizes coil driver circuit 262 to control whether mechanical disconnect 266 is open or closed. Generally, mechanical disconnect 266 provides galvanic isolation for module 230 when mechanical disconnect 266 is open.

Sensing circuit 260 measures information for module 230, including a temperature of module 230, a humidity, a current flowing between terminals 252, 254 (including a current flowing through SSSDs 234), a voltage at terminals 252, 254 and/or a voltage at SSSD 234, a power factor at terminals 252, 254, a harmonic distortion at terminals 252, 254, etc.

Module 230 utilizes snubber circuit 268 during on-off transitions of SSSDs 234 to clamp voltages transients across SSSDs 234. The components depicted for snubber circuit 268 are illustrative only, and snubber circuit 268 has different configurations in other embodiments. In this embodiment, SSSDs 234 is depicted as a pair of anti-series MOSFETs. In some embodiments, MOSFETs are arranged in serial and parallel combinations depending on the current capability of module 230.

Although module 230 in this embodiment is depicted as a single-phase device, module 230 is a 3-phase device in other embodiments. In 3-phase embodiments, module 230 includes additional instances of terminals 252, 254, SSSD 134, mechanical disconnect 266, and snubber circuits 268 for each phase.

In some embodiments, controller 222 modifies the operation of module 230 based on information measured by sensing circuit 260 by opening and closing mechanical disconnect 266 and/or SSSDs 234 based on the temperature of module 230, a humidity, the current flowing between terminals 252, 254 (including a current flowing through SSSDs 234), the voltage at terminals 252, 254 and/or a voltage at SSSDs 234, the power factor at terminals 252, 254, the harmonic distortion at terminals 252, 254, etc. For example, during current faults, currents higher than a threshold current may flow through SSSDs 234, which are sensed by controller 222 and cause controller 222 to open SSSDs 234 and/or mechanical disconnect 266. Such fault currents may further be detected by comparing the measured currents to a pre-determined time-current curve.

In another example, a temperature of module 230 higher than a threshold temperature may cause controller 222 to open SSSDs 234 and/or mechanical disconnect 266. In another embodiment, the voltage at terminals 252, 254 and/or a voltage at SSSDs 234, the power factor at terminals 252, 254, the harmonic distortion at terminals 252, 254, a humidity, etc., may cause controller 222 to initiate a transfer between first power source 204 and second power source 208. In other embodiments, any of the prior factors may trigger controller 222 to communicate this information to management controller 222, which may take any further action deemed appropriate in order to rectify non-standard operating conditions at MSTS 202.

In some embodiments, the modules 232 may include one or more of the circuits, components, or any combinations thereof that are included in modules 230 to enable the modules 232 to perform operations similar to modules 230 for connecting the load 220 to the second power source 208. It is to be appreciated by those having ordinary skill in the art that the modules 230 and modules 232 may include one or more of the above described components and/or circuits described above. It is also to be appreciated by those having ordinary skill in the art that the modules 230 and modules 232 may include other components not described herein to enable the MSTS 202 to perform the operations in accordance with the present disclosure.

Figure 4:
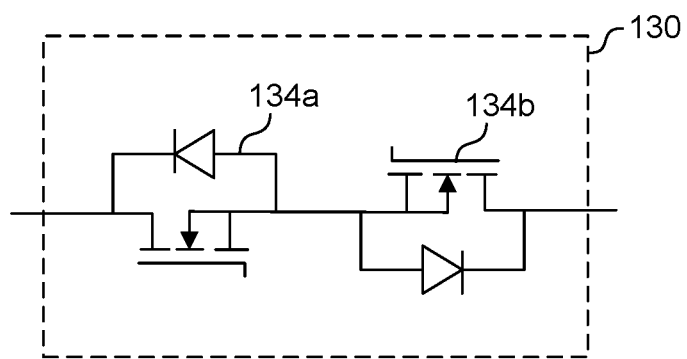
FIG. 4 illustrates a schematic diagram of a portion of system, according to some embodiments.

FIG. 4 illustrates a schematic diagram of a portion of system 100, according to some embodiments.

Switch 130 includes one or more SSSDs 134 arranged in switching pairs connected in an anti-series arrangement to enable a bi-directional flow of current at switch 130. Although switch 130 in FIG. 4 only shows one leg including SSSD 134a and SSSD 134b arranged in anti-series, it is to be appreciated that the switch 130 may include one or more legs connected in parallel between the first source 104 and transformer 112 and/or load 120. As such, each leg of switch 130 may include SSSD 134a and SSSD 134b arranged in anti-series.

The SSSDs 134 arranged in switch 130 may include, but are not limited to, SiC metal-oxide-semiconductor field-effect transistors (MOSFETs), insulated gate bipolar transistors (IGBTs), bipolar junction transistors (BJTs), junction-gate field effect transistors (JFETs), silicon controlled rectifiers (SCRs), SCRs with paralleled resistive turn-off (RTO) circuits, or any combinations thereof, according to some embodiments. In some embodiments, the SSSDs 134 may be selected from a group including SiC MOSFETS, IGBTs, BJTs, JFETs, other fully controlled switching devices, or any combinations thereof. In other embodiments, the SSSDs 134 may be selected from a group consisting of SiC MOSFETS, IGBTs, BJTs, JFETs, other fully controlled switching devices, or any combinations thereof.

Figure 5:
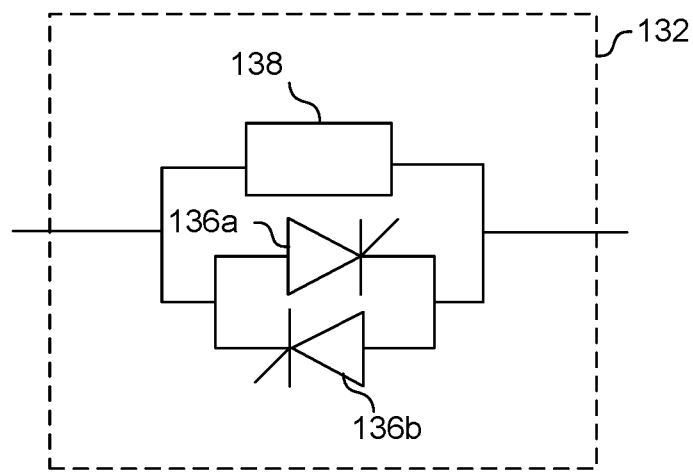
FIG. 5 illustrates a schematic diagram of a portion of system, according to some embodiments.

FIG. 5 illustrates a schematic diagram of a portion of system 100, according to some embodiments.

Switch 132 includes one or more SSSDs 136 arranged in switching pairs connected in an anti-parallel arrangement to enable switching at positive and negative half cycles of current at switch 132. Although switch 132 in FIG. 5 only shows one leg including SSSD 136a and SSSD 136b arranged in anti-parallel, it is to be appreciated that the switch 132 may include one or more legs connected in parallel between the first source 108 and transformer 112 and/or load 120. As such, each leg of switch 132 may include SSSD 136a and SSSD 136b arranged in anti-parallel.

The SSSDs 136 arranged in switch 132 may include, but are not limited to, SiC metal-oxide-semiconductor field-effect transistors (MOSFETs), insulated gate bipolar transistors (IGBTs), bipolar junction transistors (BJTs), junction-gate field effect transistors (JFETs), silicon controlled rectifiers (SCRs), SCRs with paralleled resistive turn-off (RTO) circuits 138, or any combinations thereof, according to some embodiments. In some embodiments, the SSSDs 136 may be selected from a group including SiC MOSFETs, IGBTs, BJTs, JFETs, SCRs, SCRs with paralleled RTO circuits 138, other switching devices, or any combinations thereof. In other embodiments, the SSSDs 136 may be selected from a group including SCRs, SCRs with paralleled RTO circuits 138, other thyristor based switching devices, or any combinations thereof. In yet other embodiments, the SSSDs 136 may be selected from a group consisting of SCRs, SCRs with paralleled RTO circuits 138, other thyristor based switching devices, or any combinations thereof.

Figure 6:
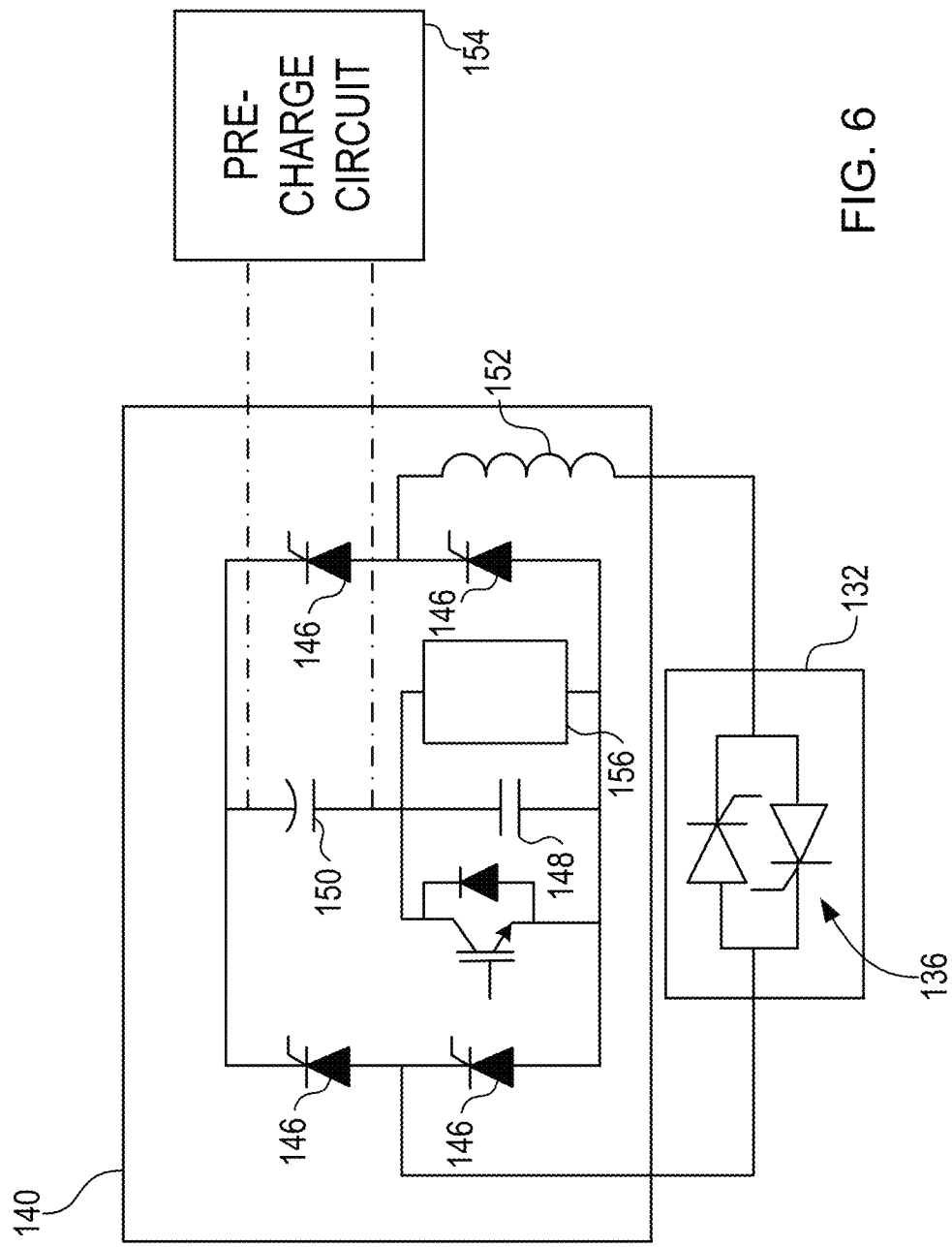
FIG. 6 illustrates a schematic diagram of a non-limiting example of a RTO circuit, according to some embodiments.

FIG. 6 illustrates a schematic diagram of a non-limiting example of an RTO circuit 140, according to some embodiments.

The RTO circuit 140 is connected in parallel with the SSSD 136 pair in switch 132 and structured to receive power and output a resonant current to the pair of SSSDs 136. It shall be appreciated that RTO circuit 140 as shown in FIG. 5 is an example embodiment of a resonant circuit according to the present disclosure. Other embodiments may include a number of additions, modifications, or alternative resonant circuit arrangements including different types and arrangements of legs, switching devices, and capacitors.

The RTO circuit 140 includes four switching devices 146, resonant capacitor 148 for energy storage, pre-charged capacitor 150, and resonant inductor 152. In some embodiments, the RTO circuit 140 includes a voltage clamp 156. The voltage clamp 156 may be a metal oxide varistor (MOV), in some embodiments. Other embodiments may include other types or arrangements of voltage clamps. In the illustrated embodiment, the RTO switching devices 146 comprise thyristors. In other embodiments, the RTO switching devices may comprise other types of semiconductor switching devices such as insulated gate bipolar transistors (IGBT).

The RTO circuit 140 provides three possible design choices to control performance: resonant capacitance value C from resonant capacitor 148, pre-charged initial capacitor voltage Vc0 from pre-charged capacitor 150, and resonant inductance value L from inductor 152. These parameters can be used to determine how much and how fast the main thyristor current can be turned off, as well as the size and cost of the auxiliary resonant circuit. The pre-charged capacitor 150 may be pre-charged by pre-charge circuit 154 to provide resonant current to create a zero-current crossing for the SSSDs 136 in switch 132. The inductor 152 limits di/dt for SSSDs 136 during turn-off. During normal conduction, only the SSSDs 136 are conducting and all the auxiliary switches 146 are off. Thus, the pre-charged resonant capacitor 150 is isolated from the SSSDs 136. In resonant turn-off operation, the corresponding auxiliary switches 146 (depending on current direction) are triggered to open by sending a gate signal thereto. As a result, the energy stored in the resonant capacitor 148 is discharged. When the resonant current through the inductor 152 exceeds the load current, the current through the SSSDs 136 is commuted to the resonant circuit. In the meantime, the capacitor 148 voltage provides a negative bias voltage to help the respective SSSDs 136 to turn off (i.e., open and stop conducting). When the respective SSSDs 136 current reaches zero, it starts turning off with reverse bias voltage from the resonant capacitor 148. All prior patents and publications referenced herein are incorporated by reference in their entireties.

The switches 132 is structured to open in response to control signals or commands received from the controller 122. To reduce the time necessary for opening the switches 132, the RTO circuit 140 may be configured and operable to output resonant current to the SSSDs 136 to force commutation and to thereby turn off. The RTO circuit 140 may thereby increase the speed at which the SSSDs 136 operate to open the switch 132 (e.g., 80% faster compared to the same SSSDs 136 without the RTO circuit 140). Further details of the operation and control of the RTO circuit 140 and switch 132 (and switches therein) may be found in International Application No. PCT/US20/64217, filed Dec. 10, 2020, the disclosure of which is hereby incorporated by reference. It shall be appreciated that the SSSD 136 is one example of an SSSD which is quasi-fully controllable by assisted or forced commutation allowing a thyristor or other semi-controllable device, which can be turned off under only certain conditions (e.g., zero current conditions) to function as a fully controlled device via the assisted or forced commutation.

The controller 122 may be operatively coupled to the SSSDs 136 in the SSSDs 136 and the controller 122 may selectively send a set of gate signals to SSSDs 136 to selectably turn each of the SSSDs 136 on (e.g., a closed or conductive state) or off (e.g., an open or non-conductive state). The controller 122 may also be operatively coupled with the RTO circuit 140 and configured to provide control signals to the four switching devices 146 to selectably turn each of these switching devices on (e.g., a closed or conductive state) or off (e.g., an open or non-conductive state). The controller 122 may also be configured and operable to receive one or more inputs indicative of voltage, current, and/or flux values at one or more nodes of system 100 and to control system 100 as further described herein.

The controller 122 operates the RTO circuit 140 to generate and provide a resonant current (IR) configured and operable to force commutation of the SSSDs 136. The resonant current (IR) causes the magnitude of the current conducted by SSSDs 136 to decrease to zero and causes a reverse voltage bias across the SSSDs 136.

It shall be appreciated that the RTO circuit 140 is one example embodiment of a resonant circuit that may be coupled in parallel with a thyristor-based SSSD such as SSSDs 136 and utilized to increase a thyristor turn-off speed by injecting a reverse current to force the thyristor current to commutate to zero. Using RTO circuit or other forms of parallel resonant circuits, thyristor-based forms the switching pair 136 (and SSSDs therein) can interrupt the current.

Figure 7:
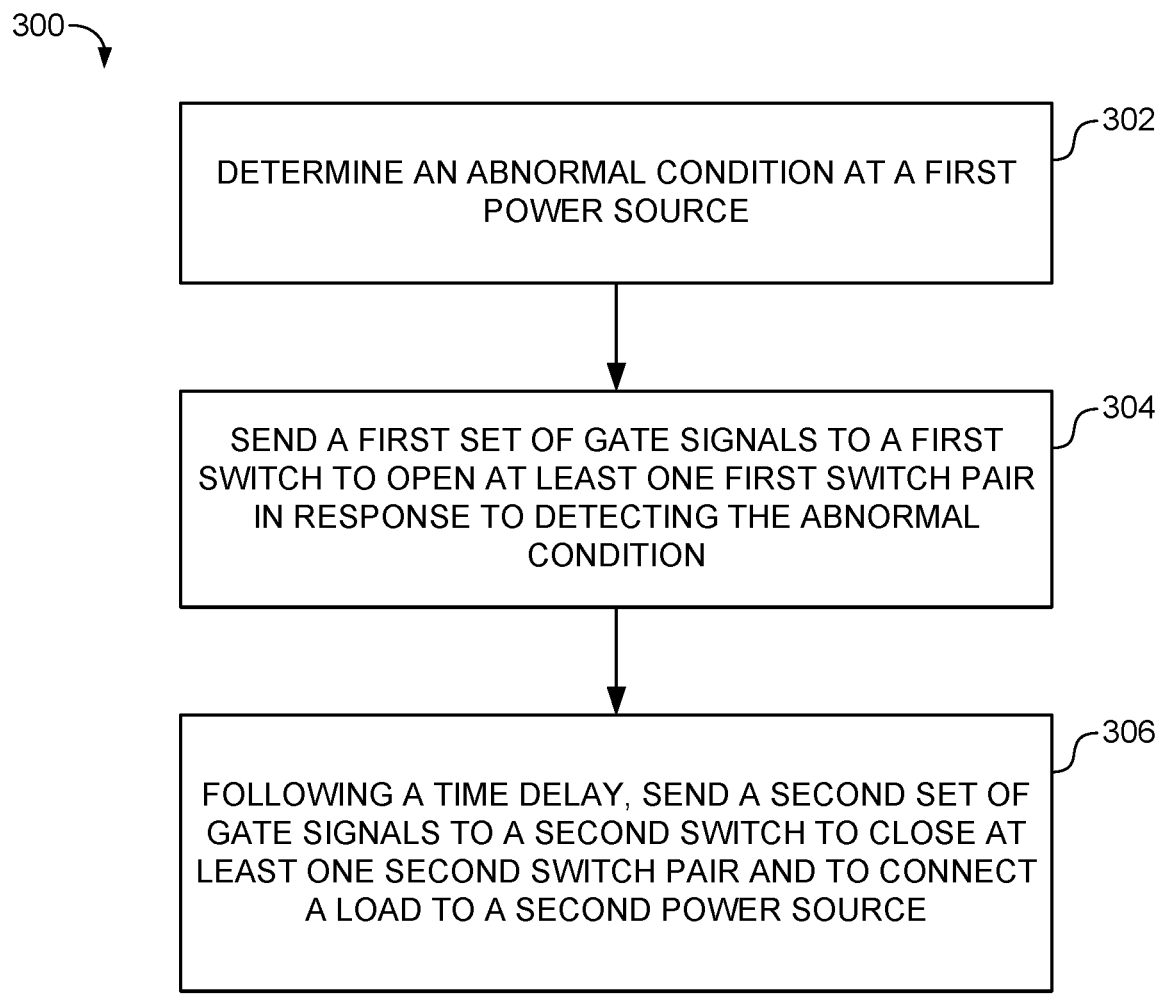
FIG. 7 is a flow diagram of a method, according to some embodiments.

FIG. 7 is a flow diagram of a method 300, according to some embodiments.

At 302, the method 300 includes determining an abnormal condition at a first power source 104 in electrical connection with the transfer switch 102. The transfer switch 102 may connect the first source 104 and the second source 108 to the load 120 and/or the transformer 112. The transfer switch 102 includes switch 130 connected between first source 104 and load 120 and includes switch 132 connected between second source 108 and load 120. In some embodiments, switch 130 includes a pair of first SSSDs 134 and switch 132 includes a pair of second SSSDs 136. In other embodiments, switch 130 includes a plurality of pairs of first SSSDs 134 arranged in parallel between the first source 104 and load 120 and switch 132 includes a plurality of pairs of SSSDs 136 arranged in parallel between second source 108 and load 120. In addition, at each of pair of SSSDs 134, the SSSDs 134 may be arranged in anti-series configuration, and at each pair of SSSDs 136, the SSSDs 136 may be arranged in anti-parallel configuration.

At 304, the method 300 includes sending, based on a first logic, a first set of gate signals to the first switch 130 to open at least one first SSSD 134 pair in response to detecting the abnormal condition at the first power source 104 to disconnect the load 120 from the first source 104 to protect the downstream electrical components. At 306, the method 300 includes following a time delay, sending, based on a second logic, a second set of gate signals to the second switch 132 to close at least one second SSSD 136 pair and to connect a load 120 to a second power source 108 to maintain uninterrupted power at the load 120. In some embodiments, the first SSSD 134 pairs in the switch 130 comprises a different type of switching devices relative to the at least one second SSSD 136 pairs in the switch 132. Moreover, in some embodiments, the delay time for transferring the load 120 between the first power source 104 and the second power source 108 based on an operation of the switch 130 may be less than 10 msec. Further, in some embodiments, the delay time for transferring the load 120 may be further configured to include when the first power source 104 and the second power source 108 are out of phase by more than 30°.

Controller 122 may monitor the condition of the first source 104 and second source 108 and may also determine whether an abnormal condition is present at the first source 104 or second source 108. Further, based on determining the presence of an abnormal condition at one of the first source 104 or second source 108, the controller 122 may control the operation of the transfer switch 102 to cause the switch 130 and switch 132 to selectively cycle on/off to transfer the load 120 from one of the first source 104 and second source 108 to the other of the first source 104 and second source 108.

To transfer the load 120 from the first source 104 to second source 108, or vice versa, controller 122 may generate the first set of signals to selectively cycle the first pair of SSSDs 134 and the second set of signals to selectively cycle the second pair of SSSDs 136 to facilitate transferring the load 120 to one of the first source 104 or second source 108. As the SSSDs 134 in switch 130 are of a different type from the SSSDs 136 in switch 132, the controller 122 may include therein a first logic to operate the SSSDs 134 and a second logic to operate the SSSDs 136. In addition, the controller 122 may include therein a logic circuit that includes both the first logic and the second logic such that the controller 122 may control the SSSDs 134 in switch 130 and SSSDs 136 in switch 132 without needing additional controllers or additional logic circuits therein. The first logic and the second logic of controller 122 may be configured to apply one or more algorithmic functions to enable the controller 122 to selectively control the cycling of the SSSDs 134 in switch 130 and the cycling of the SSSDs 136 in switch 132 to facilitate switching the load 120 from the first source 104 to the second source 108 or vice versa.

All prior patents and publications referenced herein are incorporated by reference in their entireties.

Throughout the specification and claims, the following terms take the meanings explicitly associated herein, unless the context clearly dictates otherwise. The phrases "in one embodiment," "in an embodiment," and "in some embodiments" as used herein do not necessarily refer to the same embodiment(s), though it may. Furthermore, the phrases "in another embodiment" and "in some other embodiments" as used herein do not necessarily refer to a different embodiment, although it may. All embodiments of the disclosure are intended to be combinable without departing from the scope or spirit of the disclosure.

As used herein, the term "based on" is not exclusive and allows for being based on additional factors not described, unless the context clearly dictates otherwise. In addition, throughout the specification, the meaning of "a," "an," and "the" include plural references. The meaning of "in" includes "in" and "on."

As used herein, the term "between" does not necessarily require being disposed directly next to other elements. Generally, this term means a configuration where something is sandwiched by two or more other things. At the same time, the term "between" can describe something that is directly next to two opposing things. Accordingly, in any one or more of the embodiments disclosed herein, a particular structural component being disposed between two other structural elements can be:

disposed directly between both of the two other structural elements such that the particular structural component is in direct contact with both of the two other structural elements;

disposed directly next to only one of the two other structural elements such that the particular structural component is in direct contact with only one of the two other structural elements;

disposed indirectly next to only one of the two other structural elements such that the particular structural component is not in direct contact with only one of the two other structural elements, and there is another element which juxtaposes the particular structural component and the one of the two other structural elements;

disposed indirectly between both of the two other structural elements such that the particular structural component is not in direct contact with both of the two other structural elements, and other features can be disposed therebetween; or any combination(s) thereof.

As used herein "embedded" means that a first material is distributed throughout a second material.

Aspects

Various Aspects are described below. It is to be understood that any one or more of the features recited in the following Aspect(s) can be combined with any one or more other Aspect(s).

Aspect 1. A transfer switch comprising: a first switch comprising: at least one first solid state switching device (SSSD) pair, wherein the first switch electrically connects a first power source to a load; a second switch comprising: at least one second SSSD pair, wherein the second switch electrically connects a second power source to the load; and wherein the at least one first SSSD pair comprises a different type of switching devices relative to the at least one second SSSD pair; wherein a controller is configured to selectively cycle the at least one first SSSD pair and the at least one second SSSD pair on and off to electrically couple one of the first power source and the second power source to the load.

Aspect 2. The transfer switch according to aspect 1, wherein the first switch comprises a plurality of first SSSD pairs, wherein each of the first SSSD pairs are connected in anti-series.

Aspect 3. The transfer switch according to any of the preceding aspects, wherein each switching device of the at least one first SSSD pair is selected from a group comprising SiC metal-oxide-semiconductor field-effect transistors (MOSFETs), insulated gate bipolar transistors (IGBTs), bipolar junction transistors (BJTs), junction-gate field effect transistors (JFETs), or any combinations thereof.

Aspect 4. The transfer switch according to aspect 3, wherein each switching device of the at least one first SSSD pair comprises SiC MOSFETs.

Aspect 5. The transfer switch according to any of the preceding aspects, wherein each switching device of the at least one first SSSD pair is selected from a group consisting of SiC MOSFETS, IGBTs, BJTs, JFETs, or any combinations thereof.

Aspect 6. The transfer switch according to any of the preceding aspects, wherein the second switch comprises a plurality of second SSSD pairs, wherein the plurality of second SSSD pairs are connected in anti-parallel.

Aspect 7. The transfer switch according to any of the preceding aspects, wherein each switching device of the at least one second SSSD pair is selected from a group comprising SiC MOSFETs, IGBTs, BJTS, JFETs, silicon controlled rectifiers (SCRs), SCRs with paralleled resistive turn-off (RTO) circuits, or any combinations thereof.

Aspect 8. The transfer switch according to any of the preceding aspects, wherein each switching device of the at least one second SSSD pair comprises: SCRs with paralleled RTO circuits.

Aspect 9. The transfer switch according to any of the preceding aspects, wherein each switching device of the at least one second SSSD pair is selected from a group consisting of SCRs, SCRs with paralleled RTO circuits, or any combinations thereof.

Aspect 10. The transfer switch according to any of the preceding aspects, further comprising: the controller, the controller comprises a processor and a non-transitory computer readable medium having stored thereon instructions executable by the processor to enable the controller to perform operations comprising: send a first set of gate signals to the at least one first SSSD pair to open the first switch in response to detecting an abnormal condition at the first power source, and after a time delay, sending a second set of gate signals to the at least one second SSSD pair to close the second switch and to connect the load to the second power source.

Aspect 11. The transfer switch according to aspect 10, wherein the time delay for transferring the load between the first power source and the second power source is less than 10 msec.

Aspect 12. The transfer switch according to aspects 10 or 11, wherein the controller transfers the load from the first power source to the second power source when the first power source and the second power source are out of phase by more than 30°.

Aspect 13. A computer-implemented method for operating a transfer switch including a first switch and a second switch, the method comprising: determining, by a controller, an abnormal condition at a first power source in electrical connection with the transfer switch; sending, by the controller and based on a first logic, a first set of gate signals to the first switch to open at least one first SSSD pair in response to detecting the abnormal condition at the first power source; and following a time delay, sending, by the controller and based on a second logic, a second set of gate signals to the second switch to close at least one second SSSD pair and to connect a load to a second power source, wherein the at least one first SSSD pair comprises a different type of switching devices relative to the at least one second SSSD pair.

Aspect 14. The computer-implemented method according to aspect 13, wherein the delay time for transferring the load between the first power source and the second power source is less than 10 msec.

Aspect 15. The computer-implemented method according to aspects 13 or 14, wherein the delay time for transferring the load is further configured to include when the first power source and the second power source are out of phase by more than 30°.

Aspect 16. The computer-implemented method according to aspects 13, 14, or 15, wherein the first logic is configured to operate switching devices of the at least one first SSSD pair, and the second logic is configured to operate switching devices of the at least one second SSSD pair.

Aspect 17. The method according to aspects 13, 14, 15, or 16, wherein the first switch comprises a plurality of first SSSD pairs, and the second switch comprises a plurality of second SSSD pairs, wherein each switching device in the plurality of first SSSD pairs are connected in anti-series and each switching device in the plurality of second SSSD pairs are connected in anti-parallel.

Aspect 18. A system comprising: a first power source; a second power source; an electrical load; a transfer switch comprising: a first switch comprising a plurality of first SSSD pairs connected in parallel between the first power source and the electrical load, and a second switch comprising a plurality of second SSSD pairs connected in parallel between the second power source and the electrical load, wherein the plurality of first SSSD pairs comprises different type of switching devices relative to the plurality of second SSSD pairs; and a controller comprising: a processor, and a non-transitory computer readable medium having stored thereon instructions executable by the processor to enable the controller to perform operations comprising: determine an abnormal condition at the first power source in electrical connection with the transfer switch, send a first set of gate signals to the plurality of first SSSD pairs to open the first switch in response to detecting an abnormal condition at the first power source, and after a time delay, sending a second set of gate signals to the plurality of second SSSD pairs to close the second switch and to connect the electrical load to the second power source.

Aspect 19. The system according to aspect 18, wherein each switching device of the plurality of first SSSD pairs comprises SiC MOSFETs connected in anti-series, wherein each switching device of the plurality of second SSSD pairs comprises SCRs with paralleled RTO circuits connected in anti-parallel.

Aspect 20. The system according to aspects 18 or 19, wherein the time delay for transferring the electrical load between the first power source and the second power source is less than 10 msec, wherein the controller transfers the electrical load from the first power source to the second power source when the first power source and the second power source are out of phase by more than 30°.

It is to be understood that changes may be made in detail, especially in matters of the construction materials employed and the shape, size, and arrangement of parts without departing from the scope of the present disclosure. This Specification and the embodiments described are examples, with the true scope and spirit of the disclosure being indicated by the claims that follow.

What is claimed is:

1. A transfer switch comprising:
    a first switch comprising:
        at least one first solid state switching device (SSSD) pair,
        wherein the first switch electrically connects a first power source to a load;
    a second switch comprising:
        at least one second SSSD pair,
        wherein the second switch electrically connects a second power source to the load; and
    wherein the at least one first SSSD pair comprises a different type of switching devices relative to the at least one second SSSD pair;
    wherein a controller is configured to selectively cycle the at least one first SSSD pair according to a first logic and the at least one second SSSD pair according to a second logic on and off to reduce inrush current to upstream devices when electrically coupling one of the first power source and the second power source to the load.

2. The transfer switch according to claim 1, wherein the first switch comprises a plurality of first SSSD pairs,
    wherein each of the first SSSD pairs are connected in anti-series.

3. The transfer switch according to claim 1, wherein each switching device of the at least one first SSSD pair is selected from a group comprising SiC metal-oxide-semiconductor field-effect transistors (MOSFETs), insulated gate bipolar transistors (IGBTs), bipolar junction transistors (BJTs), junction-gate field effect transistors (JFETs), or any combinations thereof.

4. The transfer switch according to claim 3, wherein each switching device of the at least one first SSSD pair comprises SiC MOSFETs.

5. The transfer switch according to claim 1, wherein each switching device of the at least one first SSSD pair is selected from a group consisting of SiC MOSFETs, IGBTs, BJTs, JFETs, or any combinations thereof.

6. The transfer switch according to claim 1, wherein the second switch comprises a plurality of second SSSD pairs,
    wherein the plurality of second SSSD pairs are connected in anti-parallel.

7. The transfer switch according to claim 1, wherein each switching device of the at least one second SSSD pair is selected from a group comprising SiC MOSFETs, IGBTs, BJTs, JFETs, silicon controlled rectifiers (SCRs), SCRs with paralleled resistive turn-off (RTO) circuits, or any combinations thereof.

8. The transfer switch according to claim 7, wherein each switching device of the at least one second SSSD pair comprises:
    SCRs with paralleled RTO circuits.

9. The transfer switch according to claim 1, wherein each switching device of the at least one second SSSD pair is selected from a group consisting of SCRs, SCRs with paralleled RTO circuits, or any combinations thereof.

10. The transfer switch according to claim 1, further comprising:
    the controller, the controller comprises a processor and a non-transitory computer readable medium having stored thereon instructions executable by the processor to enable the controller to perform operations comprising:

send a first set of gate signals to the at least one first SSSD pair to open the first switch in response to detecting an abnormal condition at the first power source, and after a time delay, sending a second set of gate signals to the at least one second SSSD pair to close the second switch and to connect the load to the second power source.

11. The transfer switch according to claim 10, wherein the time delay for transferring the load between the first power source and the second power source is less than 10 msec.

12. The transfer switch according to claim 11, wherein the controller transfers the load from the first power source to the second power source when the first power source and the second power source are out of phase by more than 30°.

13. A computer-implemented method for operating a transfer switch including a first switch and a second switch, the method comprising:

determining, by a controller, an abnormal condition at a first power source in electrical connection with the transfer switch;

sending, by the controller and based on a first logic, a first set of gate signals to the first switch to open at least one first SSSD pair in response to detecting the abnormal condition at the first power source; and following a time delay, sending, by the controller and based on a second logic, a second set of gate signals to the second switch to close at least one second SSSD pair and to connect a load to a second power source, wherein the at least one first SSSD pair comprises a different type of switching devices relative to the at least one second SSSD pair, wherein the controller is configured to selectively cycle the at least one first SSSD pair according to the first logic and the at least one second SSSD pair according to the second logic on and off to reduce inrush current to upstream devices when electrically coupling one of the first power source and the second power source to the load.

14. The computer-implemented method according to claim 13, wherein the delay time for transferring the load between the first power source and the second power source is less than 10 msec.

15. The computer-implemented method according to claim 13, wherein the delay time for transferring the load is further configured to include when the first power source and the second power source are out of phase by more than 30°.

16. The computer-implemented method according to claim 13, wherein the first logic is configured to operate switching devices of the at least one first SSSD pair, and the second logic is configured to operate switching devices of the at least one second SSSD pair.

17. The computer-implemented method according to claim 13, wherein the first switch comprises a plurality of first SSSD pairs, and the second switch comprises a plurality of second SSSD pairs, wherein each switching device in the plurality of first SSSD pairs are connected in anti-series and each switching device in the plurality of second SSSD pairs are connected in anti-parallel.

18. A system comprising:
a first power source;
a second power source;
an electrical load;
a transfer switch comprising:
a first switch comprising a plurality of first SSSD pairs connected in parallel between the first power source and the electrical load, and
a second switch comprising a plurality of second SSSD pairs connected in parallel between the second power source and the electrical load,
wherein the plurality of first SSSD pairs comprises different type of switching devices relative to the plurality of second SSSD pairs; and
a controller comprising:
a processor, and
a non-transitory computer readable medium having stored thereon instructions executable by the processor to enable the controller to perform operations comprising:
determine an abnormal condition at the first power source in electrical connection with the transfer switch,
send a first set of gate signals to the plurality of first SSSD pairs to open the first switch in response to detecting an abnormal condition at the first power source, and
after a time delay, sending a second set of gate signals to the plurality of second SSSD pairs to close the second switch and to connect the electrical load to the second power source,
wherein the controller is configured to selectively cycle the plurality of first SSSD pairs according to a first logic and the plurality of second SSSD pairs according to a second logic on and off to reduce inrush current to upstream devices when electrically coupling one of the first power source and the second power source to the electrical load.

19. The system according to claim 18, wherein each switching device of the plurality of first SSSD pairs comprises SiC MOSFETs connected in anti-series, wherein each switching device of the plurality of second SSSD pairs comprises SCRs with paralleled RTO circuits connected in anti-parallel.

20. The system according to claim 18, wherein the time delay for transferring the electrical load between the first power source and the second power source is less than 10 msec, wherein the controller transfers the electrical load from the first power source to the second power source when the first power source and the second power source are out of phase by more than 30°.

* * * * *